(12) United States Patent
Nose et al.

(10) Patent No.: US 7,086,873 B2
(45) Date of Patent: Aug. 8, 2006

(54) CONNECTOR COMPRISING AN INSULATOR AND A CONTACT RETAINED BY THE INSULATOR AND CONNECTED TO CONDUCTIVE PORTION OF A BOARD, AND METHOD OF PRODUCING THE SAME

(75) Inventors: Yasuhiro Nose, Musashimurayama (JP); Hideyuki Noguchi, Musashimurayama (JP); Toshihiro Kume, Ome (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 140 days.

(21) Appl. No.: 10/730,596

(22) Filed: Dec. 8, 2003

(65) Prior Publication Data

US 2004/0115971 A1  Jun. 17, 2004

(30) Foreign Application Priority Data

Dec. 9, 2002  (JP) .............................. 2002-357193

(51) Int. Cl.
*H01R 12/00*  (2006.01)

(52) U.S. Cl. .......................................... 439/79; 439/80

(58) Field of Classification Search ............ 439/79–83, 439/567
See application file for complete search history.

(56) References Cited

U.S. PATENT DOCUMENTS

| | | | | |
|---|---|---|---|---|
| 6,482,016 | B1 * | 11/2002 | McHugh et al. .............. | 439/79 |
| 6,733,307 | B1 * | 5/2004 | Wu .............................. | 439/79 |
| 2001/0008811 | A1 * | 7/2001 | Soga et al. ................... | 439/79 |
| 2002/0173180 | A1 * | 11/2002 | Saito ........................... | 439/79 |

FOREIGN PATENT DOCUMENTS

| | | |
|---|---|---|
| JP | 55-85771 | 6/1980 |
| JP | 3-43263 | 4/1991 |
| JP | 4061767 | 2/1992 |
| JP | 6203896 | 7/1994 |
| JP | 7153508 | 6/1996 |
| JP | 09-069371 | 3/1997 |
| JP | 9069371 | 3/1997 |
| JP | 10-154566 | 6/1998 |
| JP | 11-026058 | 1/1999 |
| JP | 2001-060650 | 3/2001 |

* cited by examiner

*Primary Examiner*—Michael C. Zarroli
(74) *Attorney, Agent, or Firm*—Collard & Roe, P.C.

(57) ABSTRACT

A terminal portion of a contact has a first portion extending from a one-side surface of an insulator, a second portion extending so as to be connected to a conductive portion of a board, and a third portion joining between the first and second portions. The second portion is bent using a joining portion between the second and third portions and as a fulcrum. The third portion is bent using, as a fulcrum, a joining portion between the first and third portions and in a direction away from the board toward the joining portion between the second and third portions.

17 Claims, 13 Drawing Sheets

CONNECTOR COMPRISING AN INSULATOR AND A CONTACT RETAINED BY THE INSULATOR AND CONNECTED TO CONDUCTIVE PORTION OF A BOARD, AND METHOD OF PRODUCING THE SAME

This application claims priority to prior Japanese application JP 2002-357193, the disclosure of which is incorporated herein by reference.

BACKGROUND OF THE INVENTION

The present invention relates to a connector having contacts connected to a board such as a printed circuit board, and a method of producing such a connector and, in particular, relates to a connector having contacts connected by soldering to conductive portions connected to a circuit of a board, and a method of producing such a connector.

In conventional connectors, there is available such a type of connector that is used so as to be mounted on a board for mutual connection between electronic or electric devices.

The connector comprises an insulator, and a plurality of contacts retained by the insulator. A terminal portion of each contact is bent from a substantially horizontal direction relative to the board to a substantially perpendicular direction so as to extend to the exterior of the insulator. A tip portion of the terminal portion serves as a solder joint portion that is inserted into a corresponding one of through holes formed in the board. The solder joint portion is fixedly soldered to the board in the state where it is inserted in the through hole. The solder joint portion is for obtaining electrical continuity with a corresponding one of conductive portions connected to an electronic circuit formed on the board (e.g. see JP-A-H04-61767).

When the connector is mounted on the board, inasmuch as environment of using the electronic circuit is often in an engine room of an automobile, or at a portion that is subjected to influence by variation in temperature of the open air, the board, the insulator, and the contacts inevitably repeat thermal expansion and retraction due to temperature variation in that atmosphere.

Consequently, a load is applied to the solder joint portion, and there is possibility of occurrence of a crack in a soldering portion. If the crack is generated in the soldering portion like this, the electrical continuity becomes incomplete at the cracked portion so that there is possibility of occurrence of failure such as electrical chattering.

The solder joint portion is fixedly soldered to the board in the state where the solder joint portion passes through the board and is exposed to a side of the board opposite to a side thereof where the connector is mounted. Accordingly, if the terminal portion having a length dimension shorter than a prescribed length dimension is soldered to the conductive portion of the board, there is possibility of occurrence of failure wherein the formation of the solder joint portion becomes incomplete, and therefore, the electrical continuity becomes incomplete at the solder joint portion.

On the other hand, if the terminal portion having a length dimension greater than the prescribed length dimension is soldered, there is possibility of occurrence of failure wherein the solder joint portion of the terminal portion interferes with another board, device or the like to thereby cause mechanical damage thereto or electrical leakage from the contact.

As other conventional connectors relating to the present invention, there are disclosed ones wherein a stress absorbing portion of a circular arc shape is formed at a bent portion of a terminal portion of each contact (e.g. see JP-A-H09-69371, JP-A-H07-153508, and JP-A-H06-203896).

With respect to the terminal portion of the contact formed with the stress absorbing portion, processing using at least three bending jigs is required for forming the stress absorbing portion of the circular arc shape.

Further, with respect to a matrix array connector having upper and lower rows of contacts that are arranged in a straight line vertically, there has been a problem that it is not applicable because, upon processing a terminal portion of a contact in the lower row, one of the jigs interferes with a contact in the upper row right over it.

SUMMARY OF THE INVENTION

It is an object of the present invention to provide a connector that can prevent an excessive stress from being applied to a solder joint portion of a contact by reducing a load applied to a joining portion between the contact and a conductive portion of a board, and further provide a method of producing such a connector.

It is another object of the present invention to provide a connector that, even when a length dimension of a terminal portion of a contact does not satisfy a prescribed value range in the production stage, can easily adjust the length dimension of the terminal portion to satisfy a prescribed length dimension of the terminal portion, and further provide a method of producing such a connector.

According to the present invention, there is obtained a connector comprising an insulator to be mounted on one surface of a board, and a conductive contact retained by the insulator, the contact including a terminal portion extending outward from a one-side surface of the insulator so as to be connected to the board, wherein the terminal portion comprises a first portion extending outward from the one-side surface of the insulator so as to be substantially parallel to the one surface of the board when the insulator is mounted on the one surface of the board, a second portion bent to extend so as to be connected to the board when the insulator is mounted on the one surface of the board, and a third portion joining between the first and second portions in a predetermined position spaced apart from the one-side surface of the insulator, the second portion is bent using a joining portion between the second and third portions as a fulcrum, and the third portion is bent using, as a fulcrum, a joining portion between the first and third portions so as to be away from the one surface of the board in a direction from the fulcrum at the joining portion between the first and third portions toward the fulcrum at the joining portion between the second and third portions when the insulator is mounted on the one surface of the board.

Further, according to the present invention, there is obtained a connector comprising an insulator to be mounted on one surface of a board, and a conductive contact retained by the insulator, the contact including a terminal portion extending outward from a one-side surface of the insulator so as to be connected to the board, wherein the terminal portion comprises a first portion extending outward from the one-side surface of the insulator so as to approach the one surface of the board when the insulator is mounted on the one surface of the board, a second portion bent to extend so as to be connected to the board when the insulator is mounted on the one surface of the board, and a third portion joining between the first and second portions in a predetermined position spaced apart from the one-side surface of the insulator, the second and third portions are bent using a joining portion between the second and third portions as a fulcrum, and the first and third portions are bent using a joining portion between the first and third portions as a fulcrum, and the third portion is bent so as to be away from the one surface of the board in a direction from the fulcrum at the joining portion between the first and third portions toward the fulcrum at the joining portion between the second and third portions when the insulator is mounted on the one surface of the board.

Further, according to the present invention, there is obtained a method of producing a connector comprising an insulator to be mounted on one surface of a board, and a conductive contact retained by the insulator, the contact including a terminal portion extending outward from a one-side surface of the insulator so as to be connected to the board, wherein the terminal portion comprises a first portion extending outward from the one-side surface of the insulator so as to be substantially parallel to the one surface of the board when the insulator is mounted on the one surface of the board, a second portion bent to extend so as to be connected to the board when the insulator is mounted on the one surface of the board, and a third portion joining between the first and second portions, the method comprising the steps of bending, after retaining the contact by the insulator, the second portion using a joining portion between the second and third portions as a fulcrum from a shape in which the second and third portions extend in the same direction as the first portion, by the use of a first bending tool so that the second portion is connected to the board; and bending the third portion at a joining portion between the first and third portions as a fulcrum by the use of a second bending tool so as to be away from the one surface of the board in a direction toward the fulcrum at the joining portion between the second and third portions when the insulator is mounted on the one surface of the board.

Further, according to the present invention, there is obtained a method of producing a connector comprising an insulator to be mounted on one surface of a board, and a conductive contact retained by the insulator, the contact including a terminal portion extending outward from a one-side surface of the insulator so as to be connected to the board, wherein the terminal portion comprises a first portion extending outward from the one-side surface of the insulator so as to approach the one surface of the board when the insulator is mounted on the one surface of the board, a second portion bent to extend so as to be connected to the board when the insulator is mounted on the one surface of the board, and a third portion joining between the first and second portions in a predetermined position spaced apart from the one-side surface of the insulator, the method comprising the steps of bending, after retaining the contact by the insulator, the second portion using a joining portion between the second and third portions as a fulcrum from a shape in which the second and third portions extend in the same direction as the first portion, by the use of a first bending tool so that the second portion is connected to the board; and bending a joining portion between the first and third portions by moving the first and third portions, using a second bending tool, such that the first portion is inclined from the one-side surface of the insulator to cause a fulcrum at the joining portion between the first and third portions to approach the one surface of the board, and the third portion extends away from the one surface of the board in a direction from the joining portion between the first and third portions toward the joining portion between the second and third portions.

DESCRIPTION OF THE PREFERRED EMBODIMENTS

Figure 1:
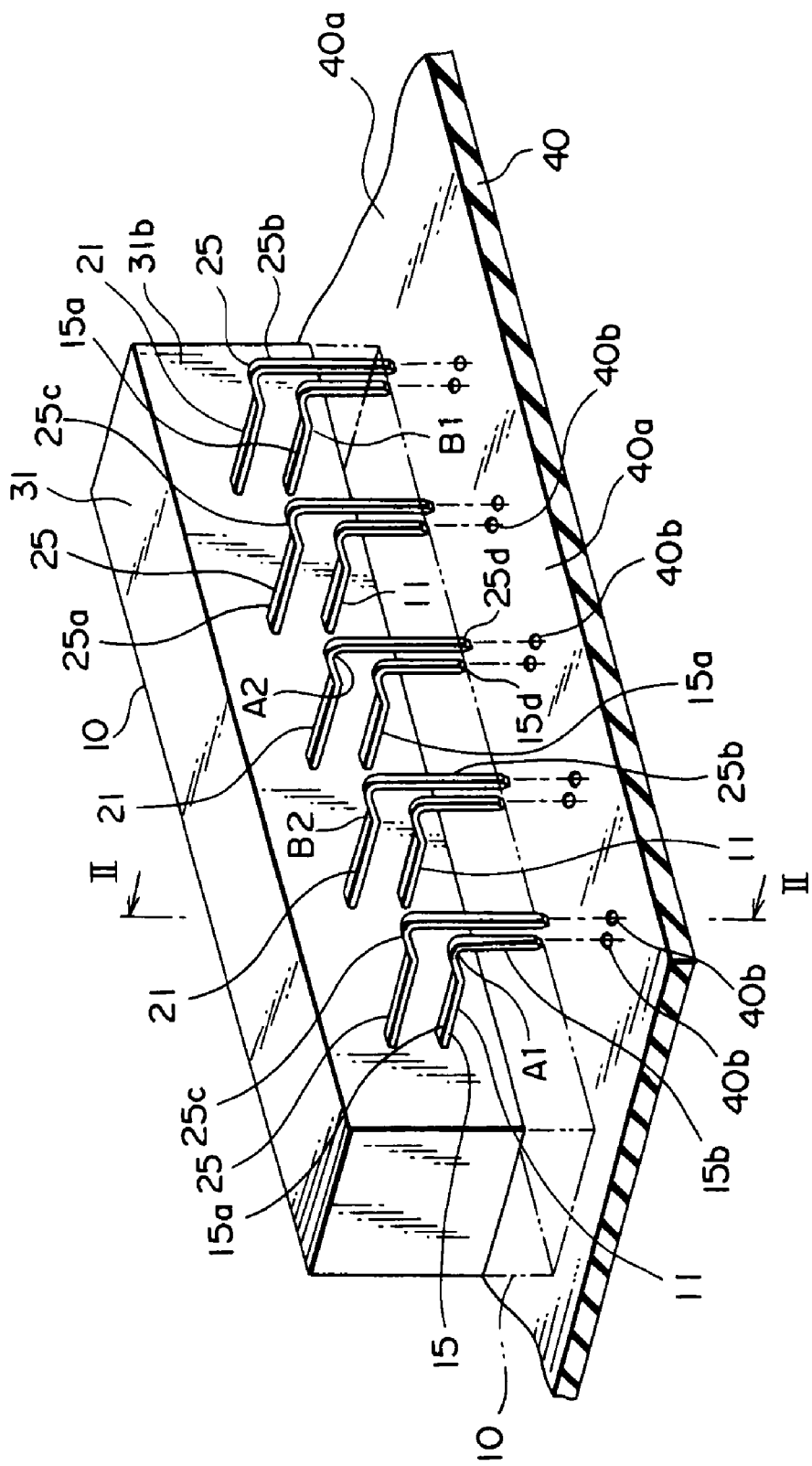
FIG. 1 is a perspective view showing, along with a board, a connector according to a first preferred embodiment of the present invention.
Figure 2:
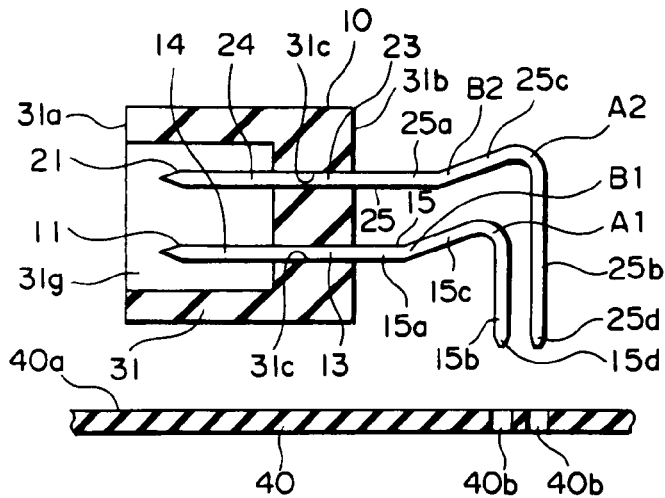
FIG. 2 is a sectional view of the connector, taken along line II—II in FIG. 1.

Hereinbelow, preferred embodiments of the present invention will be described with reference to the drawings. FIGS. 1 and 2 show the first embodiment of a connector.

Referring to FIGS. 1 and 2, a connector 10 comprises first conductive contacts 11, second conductive contacts 21, and a substantially box-shaped insulator 31 retaining the first and second contacts 11 and 21.

The connector 10 is mounted on a surface 40a of a board 40 such as a printed circuit board. The first and second contacts 11 and 21 are arranged at predetermined intervals in a row direction of the insulator 31, while arranged in two rows in a vertical direction over the surface 40a of the board 40. Specifically, in the first embodiment, the first and second contacts 11 and 21 are arranged in the row direction such that the first contacts 11 are arrayed in the lower row and the second contacts 21 are arrayed in the upper row.

Herein, although the first contact 11 and the second contact 21 differ in length dimension from each other, the shapes thereof are substantially the same. Therefore, in the following description, the first and second contacts 11 and 21 will be described simultaneously.

Each of the first and second contacts 11 and 21 comprises a retention portion 13, 23 retained by the insulator 31, a contact portion 14, 24 extending from one end of the retention portion 13, 23, and a terminal portion 15, 25 extending from the other end of the retention portion 13, 23.

In the first embodiment, each of the first and second contacts 11 and 21 is formed by blanking out an elongate belt-like shape from a conductive plate and then applying a bending process thereto. Incidentally, each of the first and second contacts 11 and 12 may be obtained by forming a conductive material into a rod shape and then bending it.

The connector 10 is fitted to a counterpart connector (not shown) so as to establish connection between the board 40 and a connection object (not shown). In the state where the connector 10 is fitted to the counterpart connector, the contact portions 14 and 24 of the first and second contacts 11 and 21 are brought into contact with counterpart contacts (not shown) of the counterpart connector in one-to-one correspondence.

The insulator 31 has an open-side surface 31a to which the counterpart connector is fitted, and a rear-side surface (one-side surface) 31b confronting the open-side surface 31a on the side opposite to the side of the open-side surface 31a.

It is desirable that the rear-side surface 31b be placed substantially perpendicular to the surface 40a of the board 40 when the connector 10 is mounted on the surface 40a of the board 40. The insulator 31 is made of an insulating material such as polybutylene terephthalate.

The contact portions 14 and 24 are located in a fitting portion 31g that is formed toward the inside of the insulator 31 from the open-side surface 31a so as to be in the form of a large groove. Each of the retention portions 13 and 23 passes through a through hole 31c formed in a rear wall, including the rear-side surface 31b, of the insulator 31 so as to extend to the exterior of the insulator 31.

Each of the terminal portions 15 and 25 extends outward from the rear-side surface 31b of the insulator 31 so as to be connected to the board 40. Each of the terminal portions 15 and 25 comprises a first portion 15a, 25a extending outward from the rear-side surface 31b of the insulator 31, a second portion 15b, 25b that is bent to extend so as to be connected to the board 40, and a third portion 15c, 25c extending between the first portion 15a, 25a and the second portion 15b, 25b to join them together.

The first portion 15a, 25a extends outward from the rear-side surface 31b of the insulator 31 so as to be substantially parallel to the surface 40a of the board 40 when the insulator 31 is mounted on the surface 40a of the board 40. The second portion 15b, 25b extends so as to be connected to the board 40 when the insulator 31 is mounted on the surface 40a of the board 40. The third portion 15c, 25c joins between the first portion 15a, 25a and the second portion 15b, 25b in a predetermined position spaced apart from the insulator 31.

The first portion 15a, 25a extends in a direction along an axis identical with that of the contact portion 14, 24. The second portion 15b, 25b is bent in a circular arc shape using, as a fulcrum A1, A2, a bending start point of a joining portion between the second portion 15b, 25b and the third portion 15c, 25c. The third portion 15c, 25c is bent using, as a fulcrum B1, B2, a bending start point of a joining portion between the first portion 15a, 25a and the third portion 15c, 25c.

The third portion 15c, 25c is bent so as to be gradually more distanced from the surface 40a of the board 40 when the insulator 31 is mounted on the surface 40a of the board 40. That is, the third portion 15c, 25c is bent so as to be inclined upward from the fulcrum B1, B2 toward the fulcrum A1, A2 between the second portion 15b, 25b and the third portion 15c, 25c.

A tip portion of the second portion 15b, 25b serves as a solder joint portion 15d, 25d. The solder joint portion 15d, 25d is a portion that is connected to a through hole (connection hole) formed in the board 40.

As described above, each of the terminal portions 15 and 25 of the first and second contacts 11 and 21 is formed into the shape that once extends in parallel to the surface 40a of the board 40, then extends in the direction away from the surface 40a of the board 40. Consequently, a length dimension of the terminal portion 15, 25 is substantially prolonged.

Figure 3:
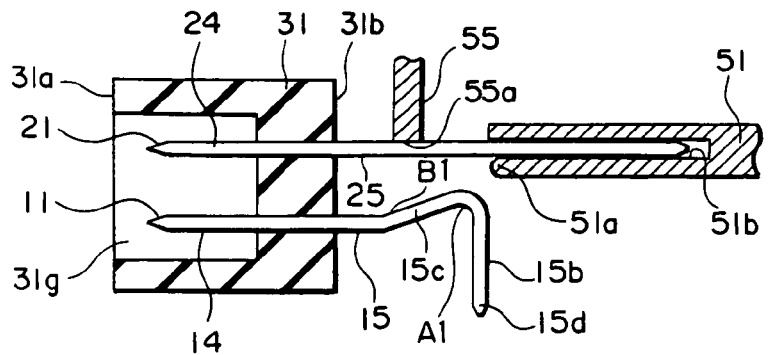
FIG. 3 is a sectional view for explaining a process of producing a contact of the connector shown in FIGS. 1 and 2.
Figure 4:
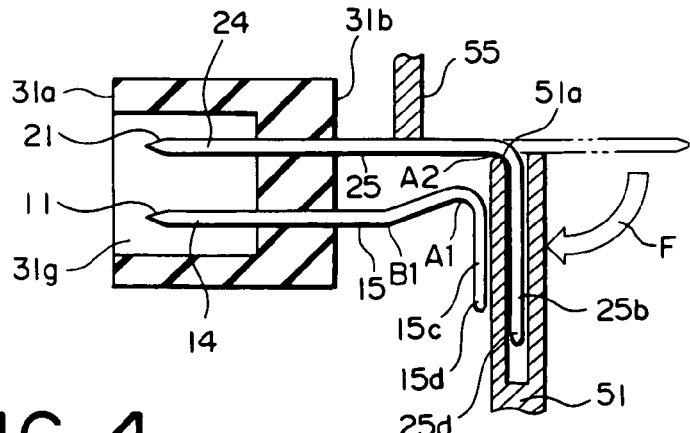
FIG. 4 is a sectional view for explaining a process of further processing the contact from a shape of the contact shown in FIG. 3.
Figure 5:
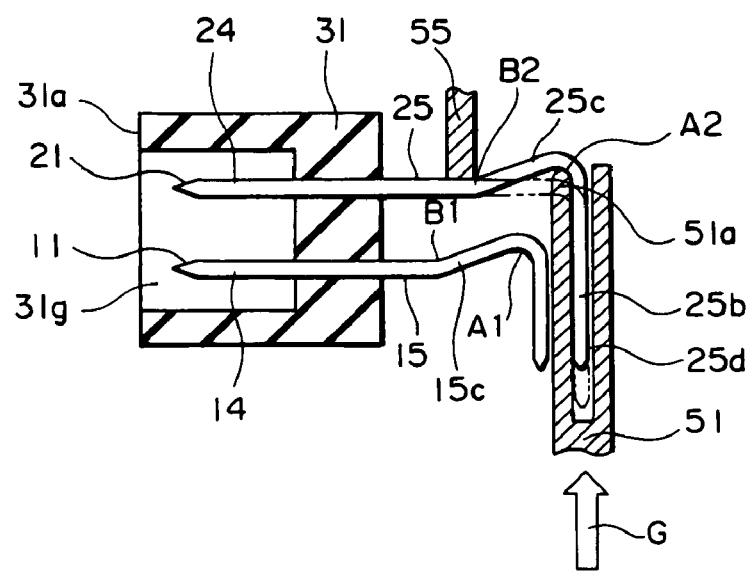
FIG. 5 is a sectional view for explaining a process of further processing the contact from a shape of the contact shown in FIG. 4.

Now, a method of forming the shapes of the first and second contacts 11 and 21 shown in FIGS. 1 and 2 will be described referring also to FIGS. 3 to 5. In FIGS. 3 to 5, the first contact 11 is shown as having the shape after having been subjected to a bending process, like in FIGS. 1 and 2.

Inasmuch as the first contact 11 is produced according to a method that is the same as a bending process for the second contact 21 which will be described hereinbelow, description about the method of producing the first contact 11 is omitted by giving description about production of the second contact 21.

As shown in FIG. 3, when the retention portion 23 of the second contact 21 is retained by the insulator 31, the second and third portions 25b and 25c thereof extend in the same direction as the first portion 25a, in the same straight-line direction as the retention portion 23. In this state, the second portion 25b is inserted into an insertion hole 51b of a first bending tool 51. Further, an end surface 55a of a second bending tool 55 is brought into contact, from above, with the joining portion between the first and third portions 25a and 25c.

From this state, the joining portion between the second and third portions 25b and 25c is bent at the fulcrum A2 by a bending force, indicated by an arrow F in FIG. 4, applied by the first bending tool 51 for connecting the second portion 25b to the board 40. By rotating the first bending tool 51 clockwise in FIG. 4 by 90° with respect to a prescribed fulcrum (not shown) as the rotation center, the bending force is applied to the joining portion between the second and third portions 25b and 25c to thereby bend it.

Incidentally, by bending the first contact 11 using the joining portion between the second and third portions 15b and 15c as the fulcrum A1 like the second contact 21 as shown in FIGS. 3 and 4, the first contact 11 is formed into the same shape as the second contact 21.

When bending the second contact 21 using the joining portion (circular arc portion) between the second and third portions 25b and 25c as the fulcrum A2, the joining portion between the second and third portions 25b and 25c is subjected to bending along a curve-shaped portion 51a formed at the tip of the first bending tool 51.

Thereafter, as shown in FIG. 5, the third portion 25c is bent so as to be more distanced from the surface 40a of the board 40 toward the joining portion between the second and third portions 25b and 25c when the insulator 31 is mounted on the surface 40a of the board 40. By moving the first bending tool 51 in a perpendicular direction (direction indicated by an arrow G in FIG. 5), the third portion 25c is bent in the direction away from the surface 40a of the board 40 toward the joining portion between the second and third portions 25b and 25c, using the joining portion between the first and third portions 25a and 25c as the fulcrum B2.

In the bending process according to this method, a die (not shown) that was conventionally necessary for bending a contact is not required. Incidentally, the bending processes using the first bending tool 51 and the second bending tool 55 may be reversed in order, or may be simultaneously carried out.

Like the second contact 21, the first contact 11 is bent using the joining portion between the second and third portions 15b and 15c as the fulcrum A1, and further bent using the joining portion between the first and third portions 15a and 15c as the fulcrum B1.

Hereinbelow, description will be given about a difference in operation between a connector that is not formed with the third portions 15c and 25c of the connector 10 produced according to the first embodiment, and the connector 10 produced according to the first embodiment.

Figure 6:
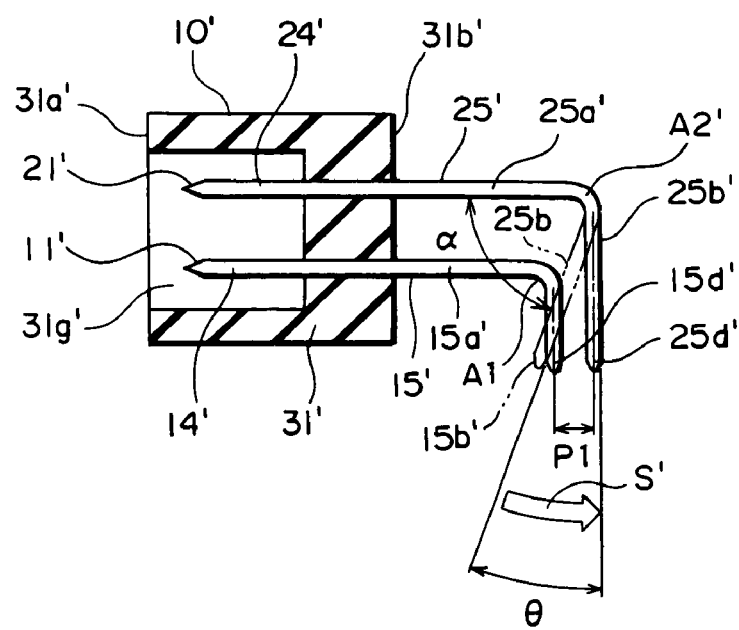
FIG. 6 is a sectional view showing one example of a connector that is not formed with third portions, for comparing an operation thereof with that of the connector of the first preferred embodiment.
Figure 7:
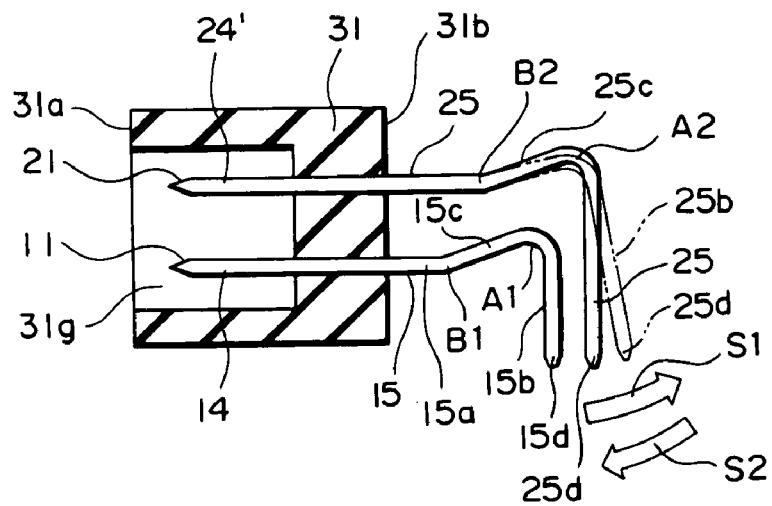
FIG. 7 is a sectional view for explaining an operation of the contact produced according to the first preferred embodiment as shown in FIGS. 1 and 2.

FIG. 6 shows one example of a connector that is not formed with the third portions 15c and 25c of the connector 10 produced according to the first embodiment. FIG. 7 shows the connector 10 produced according to the first embodiment.

With respect to the connector shown in FIG. 6, corresponding portions are assigned the same symbols with a dash ' for facilitating comparison with the connector 10 shown in FIG. 7.

As shown in FIG. 6, in each of first and second contacts 11' and 21' of a connector 10', a second portion 15b', 25b' of a terminal portion 15', 25' is bent perpendicularly relative to a first portion 15a', 25a' using a joining portion between the first portion 15a', 25a' and the second portion 15b', 25b' as a fulcrum A1', A2'.

Accordingly, the terminal portion 15', 25' is bent only at one portion, i.e. only at the joining portion between the first portion 15a', 25a' and the second portion 15b', 25b'. Consequently, for achieving a right angle as a bending angle α between the first portion 15a', 25a' and the second portion 15b', 25b', it is necessary to set the bending angle α a expecting an angle θ of about 5 to 20° as a springback S' in advance.

Consequently, at the second portions 15b' and 25b', interference may be caused between adjacent solder joint portions 15d' and 25d'. Specifically, if a pitch P1 between the solder joint portions 15d' and 25d' of the terminal portions 15' and 25' is set narrow, when bending the second portion 25b', the solder joint portion 25d' of the second portion 25b' interferes with the solder joint portion 15d' of the second portion 15b' that has already been bent. Therefore, at the second portions 15b' and 25b', the pitch P1 between the adjacent solder joint portions 15d' and 25d' should be set greater than a predetermined value.

In contrast to the connector 10' shown in FIG. 6, with respect to the first and second contacts 11 and 21 of the connector 10 in the first embodiment, when forming the shape of the terminal portion 15, 25, each of the first and second contacts 11 and 21 is, as shown in FIG. 7, bent in opposite directions at the joining portion between the first portion 15a, 25a and the third portion 15c, 25c, and at the joining portion between the second portion 15b, 25b and the third portion 15c, 25c.

Since directions in which springbacks S1 and S2 occur are also opposite to each other at the joining portion between the first portion 15a, 25a and the third portion 15c, 25c, and at the joining portion between the second portion 15b, 25b and the third portion 15c, 25c, the springbacks S1 and S2 are canceled on the whole.

Therefore, with respect to the first and second contacts 11 and 21 in the first embodiment, it is possible to solve the problem of interference between the solder joint portions 15d' and 25d' of the terminal portions 15' and 25' caused by the springback S' as shown in FIG. 6. Consequently, in case of the first and second contacts 11 and 21 in the first embodiment, it is possible to achieve the 90° bending equivalent to that of the first and second contacts 11' and 21' shown in FIG. 6 without expecting the springbacks upon performing the bending process.

Further, in case of the first and second contacts 11 and 21 in the first embodiment, inasmuch as the problem of interference between the solder joint portions 15d and 25d is not raised, an interval or pitch between the second portions 15b and 25b can be set narrower. This makes it possible to reduce a mounting area of the connector 10 on the board 40 as compared with the connector 10' shown in FIG. 6.

Figure 8:
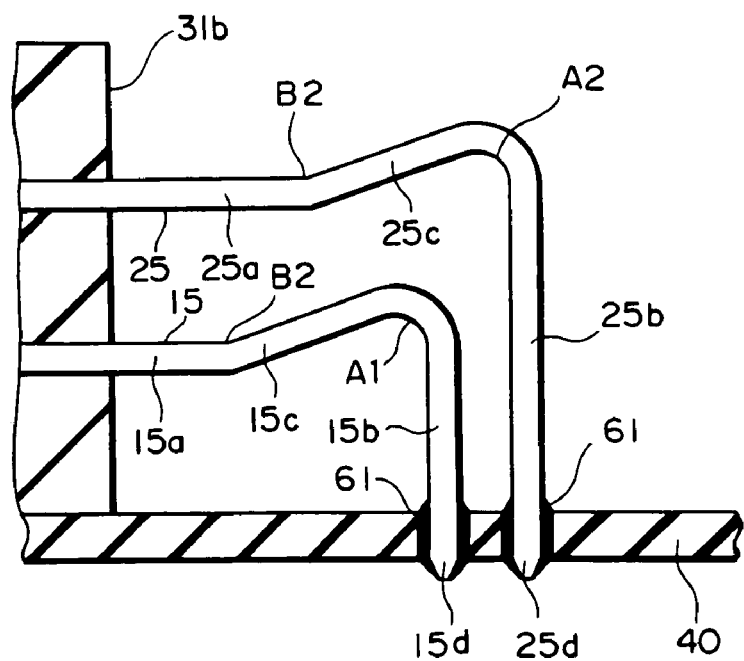
FIG. 8 is an enlarged sectional view showing the state where the connector shown in FIGS. 1 and 2 is mounted on the board, and the contacts thereof are connected to conductive portions of the board.

FIG. 8 shows the state where the connector 10 shown in FIG. 2 is mounted on the board 40. As shown in FIG. 8, the solder joint portions 15d and 25d of the second portions 15b and 25b are inserted into through holes 40b formed in the board 40, and connected thereto by solder 61 after length dimensions of the terminal portions 15 and 25 have been adjusted.

Figure 9:
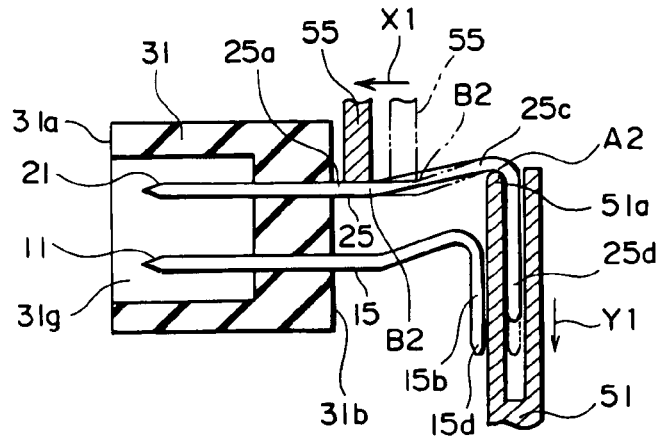
FIG. 9 is a sectional view showing a method of adjusting a length dimension of a terminal portion of the contact when the length dimension of the terminal portion of the contact as explained in FIG. 5 does not reach a prescribed value.

FIG. 9 shows a method of adjusting the length dimension of the terminal portion 25 when the length dimension of the terminal portion 25 of the second contact 21 as explained referring to FIG. 5 does not reach a prescribed value necessary for the connection by soldering.

Referring to FIG. 9, when the length dimension of the terminal portion 25 does not reach the prescribed value, i.e. when the length dimension of the terminal portion 25 is less than the prescribed value, the length dimension of the terminal portion 25 is shortened. For shortening the length dimension of the terminal portion 25, the position of the fulcrum B2 as the bending start point of the joining portion between the first and third portions 25a and 25c is moved toward the rear-side surface 31b of the insulator 31 (in a direction of an arrow X1 shown in FIG. 9) to thereby shorten a length dimension of the terminal portion 25 required for formation of the terminal portion 25 from the fulcrum B2 to the solder joint portion 25d. As a result, it becomes possible to move the position of the solder joint portion 25d toward the board 40 (in a direction of an arrow Y1 shown in FIG. 9). Through the adjustment of the terminal portion 25 as described above, the prescribed value of the length dimension of the terminal portion 25 can be easily satisfied.

Figure 10:
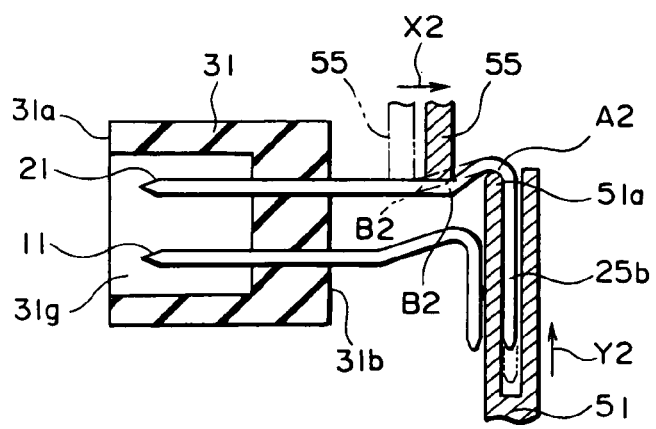
FIG. 10 is a sectional view showing a method of adjusting a length dimension of the terminal portion of the contact when the length dimension of the terminal portion of the contact as explained in FIG. 5 exceeds a prescribed value.

FIG. 10 shows a method of adjusting the length dimension of the terminal portion 25 when the length dimension of the terminal portion 25 of the second contact 21 as explained referring to FIG. 5 exceeds the prescribed value necessary for soldering.

Referring to FIG. 10, when the length dimension of the terminal portion 25 exceeds the prescribed value, i.e. when the length dimension of the terminal portion 25 is greater than the prescribed value, the length dimension of the terminal portion 25 is prolonged. For prolonging the length dimension of the terminal portion 25, the position of the fulcrum B2 as the bending start point of the joining portion between the first and third portions 25a and 25c is moved away from the rear-side surface 31b of the insulator 31 (in a direction of an arrow X2 shown in FIG. 10) to thereby prolong a length dimension of the terminal portion 25 required for formation of the terminal portion 25 from the fulcrum B2 to the solder joint portion 25d. As a result, it becomes possible to move the position of the solder joint portion 25d toward the board 40 (in a direction of an arrow Y2 shown in FIG. 10).

In case of the connector 10, through the adjustment of the terminal portion 25 as described above, the prescribed value of the length dimension of the terminal portion 25 can be easily satisfied. Incidentally, in case of the conventional connector, it was necessary to remodel a contact press die to newly produce contacts with a changed length dimension of a terminal portion, or remodel a die to newly produce an insulator, thereby to perform again assembling of a product. This requires much cost and labor, and a time loss is also large.

According to the connector 10 of the first embodiment, the adjustment conforming to the actual state is enabled so that the prescribed dimension can be easily satisfied for a short time without increasing the cost.

Figure 11:
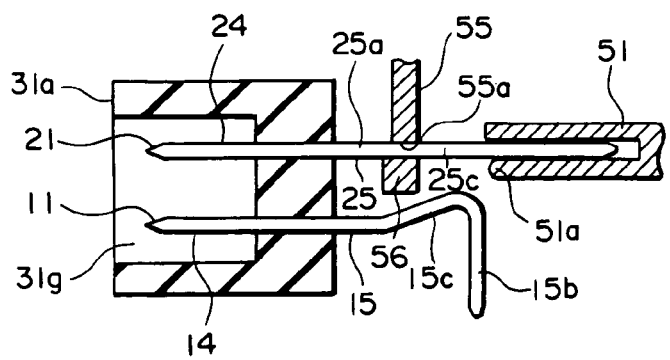
FIG. 11 is a sectional view showing a modification of the method of adjusting the length dimension of the terminal portion in the bending process of the contact as explained in FIGS. 3 to 5.

FIG. 11 shows a modification of the method of adjusting the length dimension in the terminal portion 25 in the bending process of the second contact 21 as explained referring to FIGS. 3 to 5.

Referring to FIG. 11, the end surface 55a of the second bending tool 55 is brought into contact, from above, with the joining portion between the first and third portions 25a and 25c. Further, a third bending tool 56 is brought into contact, from below, with the joining portion between the first and third portions 25a and 25c.

Inasmuch as the second and third bending tools 55 and 56 cooperatively clamp the joining portion between the first and third portions 25a and 25c so as to sandwich it therebetween, it is possible to prevent the terminal portion 25 from being deformed or from being pulled in a direction parallel to the board 40 so as to be deviated, during the bending process.

Figure 12:
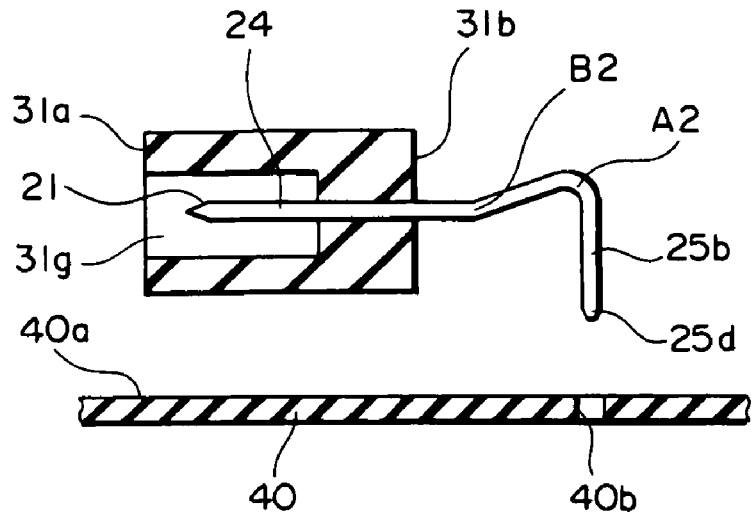
FIG. 12 is a sectional view showing a modification wherein contacts are arranged only in one row and retained by an insulator shown in FIGS. 1 and 2.

FIG. 12 shows a modification wherein only the contacts 21 are arranged in one row and retained by the insulator 31 shown in FIGS. 1 and 2.

Figure 13:
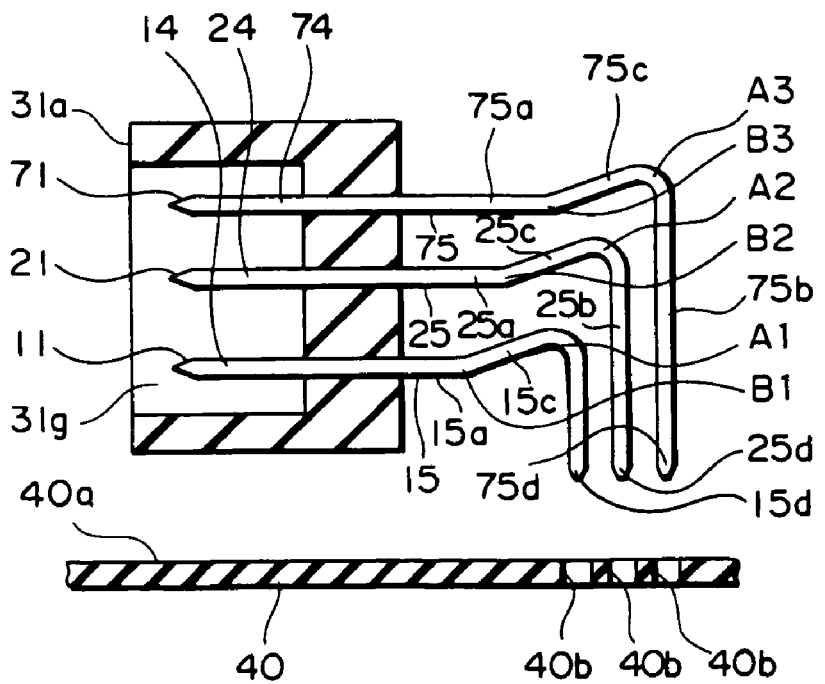
FIG. 13 is a sectional view showing a modification wherein contacts are arranged in multi-rows and retained by an insulator shown in FIGS. 1 and 2.

FIG. 13 shows a modification wherein the first and second contacts 11 and 21, and third contacts 71 in a further upper row are arranged in three rows and retained by the insulator 31 shown in FIGS. 1 and 2.

Each third contact 71 comprises a retention portion 73, a contact portion 74, and a terminal portion 75 having shapes like the shapes of those of the first and second contacts 11 and 21. The terminal portion 75 comprises a first portion 75a, a second portion 75b, and a third portion 75c having shapes like the shapes of those of the terminal portions 15 and 25 of the first and second contacts 11 and 21. The terminal portion 75 has a fulcrum A3 at a joining portion between the second and third portions 75b and 75c, and a fulcrum B3 at a joining portion between the first and third portions 75a and 75c.

A tip portion of the terminal portion 75 serves as a solder joint portion 75d. The solder point portion 75d is inserted into a through hole 40b of the board 40 and connected thereto by soldering.

Figure 14:
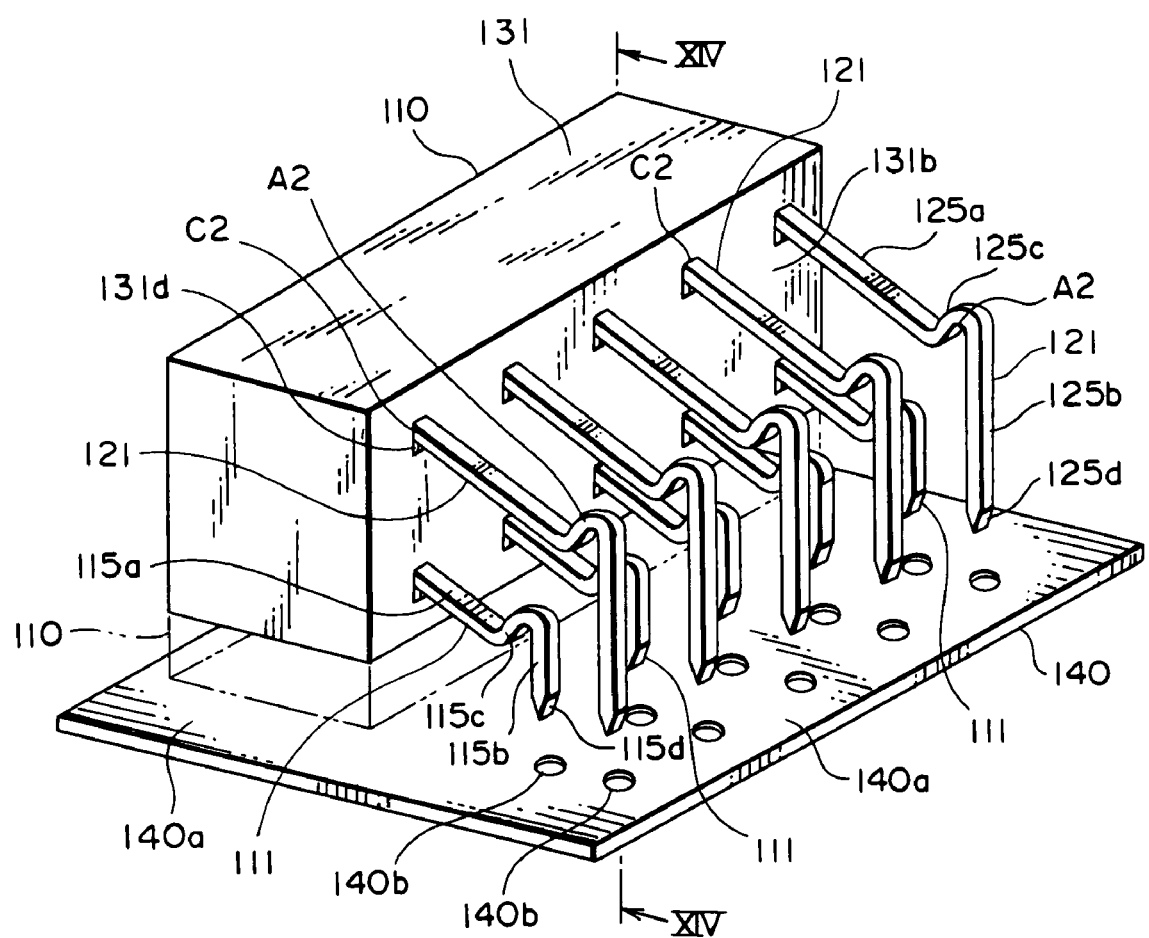
FIG. 14 is a perspective view showing, along with a board, a connector according to a second preferred embodiment of the present invention.
Figure 15:
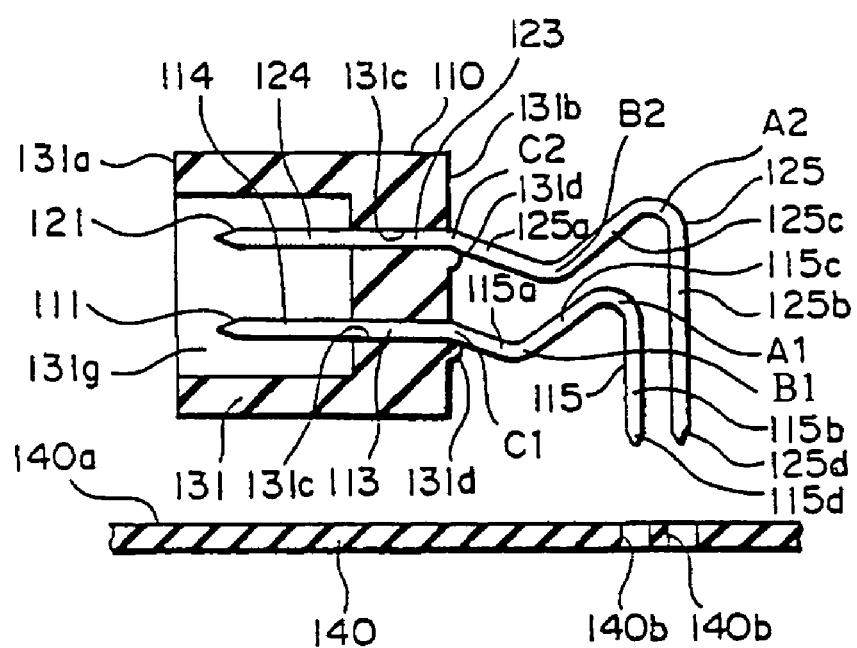
FIG. 15 is a sectional view of the connector, taken along line XIV—XIV in FIG. 14.

FIG. 14 shows, along with a board, a connector according to the second preferred embodiment of the present invention. FIG. 15 is a sectional view of the connector shown in FIG. 14.

Referring to FIGS. 14 and 15, a connector 110 comprises first conductive contacts 111, second conductive contacts 121, and an insulator 131 retaining the first and second contacts 111 and 121.

The first and second contacts 111 and 121 are retained by the insulator 131 and arranged at predetermined intervals in a row direction of the insulator 131, while arranged in two rows in a vertical direction over a surface 140a of a board 140. Specifically, in the second embodiment, the first and second contacts 111 and 121 are arranged in the row direction such that the first contacts 111 are arrayed in the lower row and the second contacts 121 are arrayed in the upper row.

The insulator 131 has an open-side surface 131a to which a counterpart connector is fitted, and a rear-side surface (one-side surface) 131b confronting the open-side surface 131a on the side opposite to the side of the open-side surface 131a.

It is desirable that the rear-side surface 131b of the insulator 131 be placed substantially perpendicular to the surface 140a of the board 140 when the connector 110 is mounted on the surface 140a of the board 140. The insulator 131 is made of an insulating material such as polybutylene terephthalate.

Herein, although the first contact 111 and the second contact 121 differ in length dimension from each other, the shapes thereof are substantially the same. Therefore, in the following description, the first and second contacts 111 and 121 will be described simultaneously.

Contact portions 114 and 124 of the first and second contacts 111 and 121 are located in a fitting portion 131g that is formed toward the inside of the insulator 131 from the open-side surface 131a so as to be in the form of a large groove. Each of retention portions 113 and 123 passes through a through hole 131c formed in a rear wall, including the rear-side surface 131b, of the insulator 131 so as to extend to the exterior of the insulator 131. Each of terminal portions 115 and 125 extends outward from the rear-side surface 131b of the insulator 131 so as to be connected to the board 140.

Further, each of the terminal portions 115 and 125 comprises a first portion 115a, 125a extending outward from the rear-side surface 131b of the insulator 131, a second portion 115b, 125b that is bent to extend so as to be connected to the board 140, and a third portion 115c, 125c extending between the first portion 115a, 125a and the second portion 115b, 125b to join them together.

The first portion 115a, 125a extends outward from the rear-side surface 131b of the insulator 131 so as to approach the surface 140a of the board 140 when the insulator 131 is mounted on the surface 140a of the board 140. The second portion 115b, 125b extends so as to be connected to the board 140 when the insulator 131 is mounted on the surface 140a of the board 140. The third portion 115c, 125c joins between the first portion 115a, 125a and the second portion 115b, 125b in a predetermined position spaced apart from the insulator 131.

The second portion 115b, 125b and the third portion 115c, 125c are bent at a fulcrum A1, A2 serving as a bending start point in a joining portion between the second portion 115b, 125b and the third portion 115c, 125c. The first portion 115a, 125a and the third portion 115c, 125c are bent at a fulcrum B1, B2 serving as a bending start point in a joining portion between the first portion 115a, 125a and the third portion 115c, 125c.

The third portion 115c, 125c is bent so as to be more distanced from the surface 140a of the board 140 in a direction from the joining portion between the first portion 115a, 125a and the third portion 115c, 125c toward the joining portion between the second portion 115b, 125b and the third portion 115c, 125c when the insulator 131 is mounted on the surface 140a of the board 140.

A joining portion between the retention portion 113, 123 and the first portion 115a, 125a of each of the first and second contacts 111 and 121 is bent at a fulcrum C1, C2 on the side of the rear-side surface 131b. The first portion 115a, 125a is formed so as to be inclined downward toward the surface 140a of the board 140. A tip portion of the second portion 115b, 125b serves as a solder joint portion 115d, 125d which is connected to a through hole 140b formed in the board 140.

Figure 16:
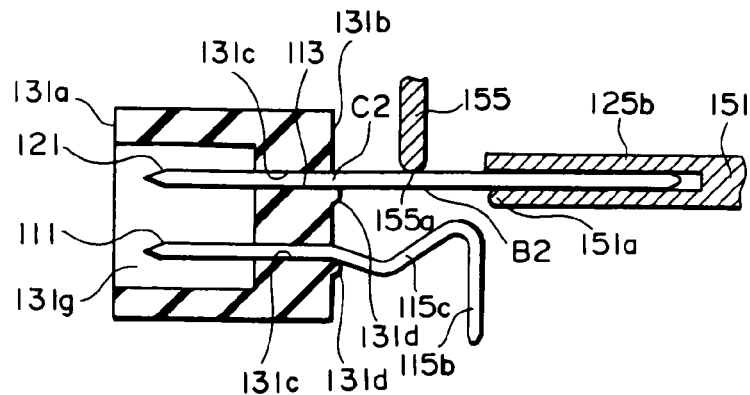
FIG. 16 is a sectional view for explaining a process of producing a contact of the connector shown in FIGS. 14 and 15.
Figure 17:
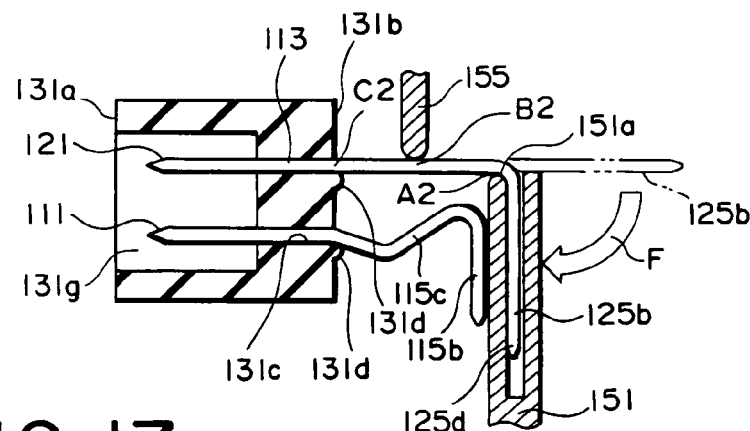
FIG. 17 is a sectional view for explaining a process of further processing the contact from a shape of the contact shown in FIG. 16.
Figure 18:
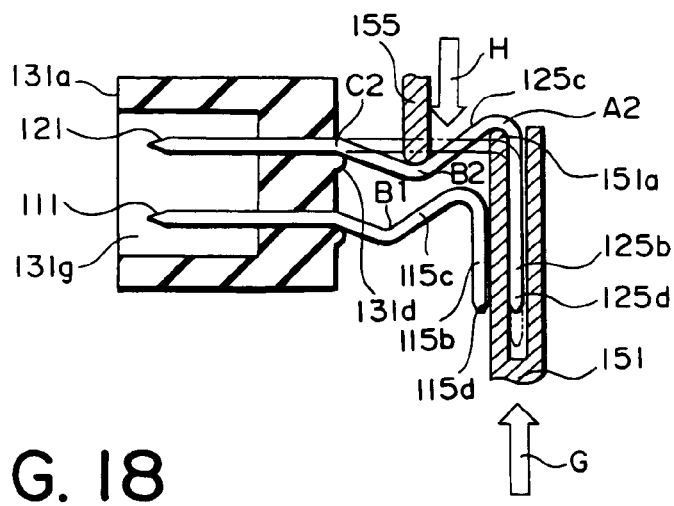
FIG. 18 is a sectional view for explaining a process of further processing the contact from a shape of the contact shown in FIG. 17.

Now, a method of forming the shapes of the first and second contacts 111 and 121 shown in FIGS. 14 and 15 will be described referring also to FIGS. 16 to 18. In FIGS. 16 to 18, the first contact 111 is shown as having the shape after having been subjected to a bending process, like in FIGS. 14 and 15.

Inasmuch as the first contact 111 is produced according to a method that is the same as a bending process for the second contact 121 which will be described hereinbelow, description about the method of producing the first contact 111 is omitted by giving description about production of the second contact 121.

As shown in FIGS. 16 and 17, when the retention portion 123 of the second contact 121 is retained by the insulator 131, the retention portion 123 and the second and third portions 125b and 125c of the second contact 121 extend in the same direction as the first portion 125a. In this state, the second portion 125b is inserted into an insertion hole 151b of a first bending tool 151. Further, an end surface 155a of a second bending tool 155 is brought into contact, from above, with the joining portion between the first and third portions 125a and 125c.

From this state, for connecting the second portion 125b to the board 140, the joining portion between the second and third portions 125b and 125c is bent at the fulcrum A2 by rotating the first bending tool 151 clockwise (indicated by an arrow F in FIG. 17) by 90° with respect to a prescribed fulcrum (not shown) as the rotation center to thereby apply a bending force to the joining portion between the second and third portions 125b and 125c. Incidentally, the first contact 111 is shown as having already been bent using the joining portion between the second and third portions 115b and 115c as the fulcrum A1.

When bending the second contact 121 using the joining portion (circular arc portion) between the second and third portions 125b and 125c as the fulcrum A2, the joining portion between the second and third portions 125b and 125c is subjected to bending along a curve-shaped portion 151a formed at the tip of the first bending tool 151.

Thereafter, as shown in FIG. 18, the first portion 125a is bent so as to approach the surface 140a of the board 140 from the fulcrum C2 adjacent to the rear-side surface 131b of the insulator 131 toward the fulcrum B2 at the joining portion between the first and third portions 125a and 125c, while the third portion 125c is bent so as to be away from the surface 140a of the board 140 in a direction from the fulcrum B2 toward the fulcrum A2 at the joining portion between the second and third portions 125b and 125c.

In this event, the bending process is carried out by moving the first bending tool 151 in a perpendicular direction away from the surface 140a of the board 140 (direction indicated by an arrow G in FIG. 18) using the joining portion between the first and third portions 125a and 125c as the fulcrum B2, and by moving the second bending tool 155 in a direction (direction indicated by an arrow H in FIG. 18) so that the fulcrum B2 at the joining portion between the first and third portions 125a and 125c approaches the surface 140a of the board 140.

According to this production method, the first bending tool 151 is rotated by 90° with respect to the prescribed fulcrum as the rotation center, thereafter, the fulcrum B2 is moved in the direction H as shown in FIG. 18 by the use of the second bending tool 155, and the first bending tool 151 is moved in the direction G as shown in FIG. 18. The first portion 125a is bent in the direction to approach the board 140, along a projection 131d that is formed on the rear-side surface 131b at the side of the insulator 131 near the surface 140a of the board 140 and in the neighborhood of the through hole 131c so as to be projected in a semicircular shape in cross section. The projection 131d may have a shape that is projected from the rear-side surface 131b so as to be inclined in a tapered shape.

Accordingly, it is sufficient as long as the projection 131d is formed on the rear-side surface 131b at the side near the board 140, while the projection 131d may be formed over the whole length dimension of the first portion 115a, 125a.

Incidentally, the bending processes using the first bending tool 151 and the second bending tool 155 may be reversed in order, or may be simultaneously carried out. Like the second contact 121, the first contact 111 is bent using the joining portion between the second and third portions 115*b* and 115*c* as the fulcrum A1, and further bent using the joining portion between the first and third portions 115*a* and 115*c* as the fulcrum B1.

Hereinbelow, description will be given about a difference in operation between a connector that is not formed with the third portions 115*c* and 125*c* of the connector 110 produced according to the second embodiment, and the connector 110 produced according to the second embodiment.

Figure 19:
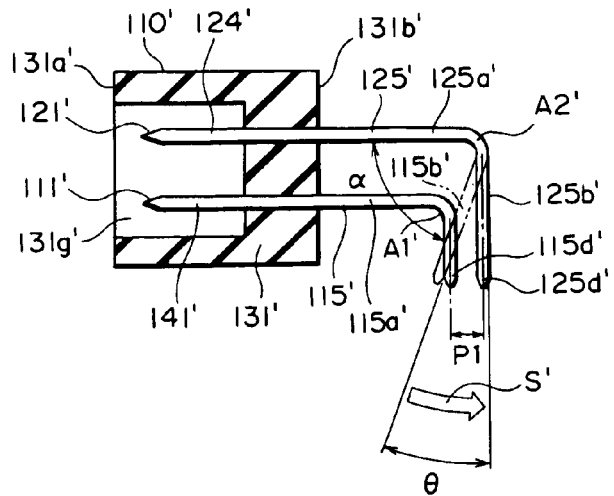
FIG. 19 is a sectional view showing one example of a connector that is not formed with third portions, for comparing an operation thereof with that of the connector of the second preferred embodiment.
Figure 20:
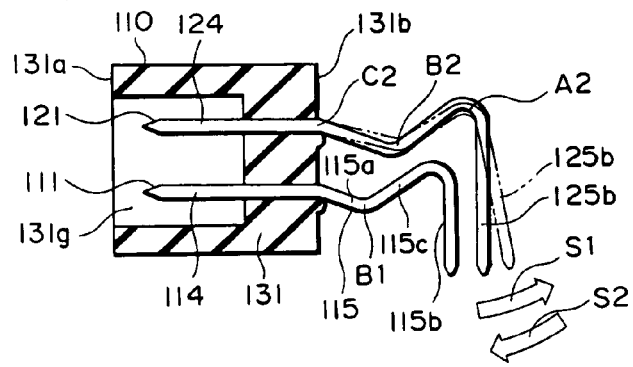
FIG. 20 is a sectional view for explaining an operation of the contact produced according to the second preferred embodiment.

FIG. 19 shows one example of a connector that is not formed with the third portions 115*c* and 125*c* of the connector 110 produced according to the second embodiment. FIG. 20 shows the connector 110 produced according to the second embodiment.

With respect to the connector shown in FIG. 19, corresponding portions are assigned the same symbols with a dash ' for facilitating comparison with the connector 110 shown in FIG. 20.

As shown in FIG. 19, in each of first and second contacts 111' and 121' of a connector 110', a second portion 115*b*', 125*b*' of a terminal portion 115', 125' is bent perpendicularly relative to a first portion 115*a*', 125*a*' using a joining portion between the first portion 115*a*', 125*a*' and the second portion 115*b*', 125*b*' as a fulcrum A1', A2'.

Accordingly, the terminal portion 115', 125' is bent only at one portion, i.e. only at the joining portion between the first portion 115*a*', 125*a*' and the second portion 115*b*', 125*b*'. Consequently, for achieving 90° as a bending angle α between the first portion 115*a*', 125*a*' and the second portion 115*b*', 125*b*', it is necessary to set the bending angle α expecting an angle θ of about 5 to 20° as a springback S' in advance.

Consequently, at the tip portions of the second portions 115*b*' and 125*b*', interference may be caused between the adjacent second portions 115*b*' and 125*b*'. Specifically, if a pitch P1 between the solder joint portions 115*d*' and 125*d*' of the terminal portions 115' and 125' is set narrow, when bending the second portion 125*b*', the solder joint portion 125*d*' of the second portion 125*b*' interferes with the solder joint portion 115*d*' of the second portion 115*b*' that has already been bent. Therefore, at the second portions 115*b*' and 125*b*', the pitch P1 between the adjacent solder joint portions 115*d*' and 125*d*' should be set greater than a predetermined value.

In contrast to the first and second contacts 111' and 121' shown in FIG. 19, with respect to the first and second contacts 111 and 121 in the second embodiment shown in FIG. 20, when forming the shape of the terminal portion 115, 125, each of the first and second contacts 111 and 121 is bent in opposite directions at the joining portion between the first portion 115*a*, 125*a* and the third portion 115*c*, 125*c*, and at the joining portion between the second portion 115*b*, 125*b* and the third portion 115*c*, 125*c*. Consequently, directions in which springbacks S1 and S2 occur are also opposite to each other at the joining portion between the first portion 115*a*, 125*a* and the third portion 115*c*, 125*c*, and at the joining portion between the second portion 115*b*, 125*b* and the third portion 115*c*, 125*c*, so that the springbacks S1 and S2 are canceled on the whole.

Therefore, with respect to the first and second contacts 111 and 121 in the second embodiment, it is possible to solve the problem of interference between the solder joint portions 115*d*' and 125*d*' of the terminal portions 115' and 125' caused by the springback S' as shown in FIG. 19. Consequently, in case of the first and second contacts 111 and 121 in the second embodiment, it is possible to achieve the 90° bending equivalent to that of the first and second contacts 111' and 121' shown in FIG. 19 without expecting the springbacks upon performing the bending process. Further, in case of the first and second contacts 111 and 121 in the second embodiment, inasmuch as the problem of interference between the solder joint portions 115*d* and 125*d* is not raised, an interval or pitch between the second portions 115*b* and 125*b* can be set narrower. This makes it possible to reduce a mounting area of the connector 110 on the board 140 as compared with the connector 110' shown in FIG. 19.

Incidentally, the terminal portion 115', 125' of the contact 111', 121' shown in FIG. 19 has a portion substantially parallel to the board 140 after exposure to the exterior of the insulator 131', then is bent downward. On the other hand, the terminal portion of 115, 125 of the contact 111, 121 in the second embodiment has a portion approaching the board 140 after exposure to the exterior of the insulator 131, then is bent upward and further bent downward.

As described above, since the terminal portion 115, 125 of the contact 111, 121 is formed into the shape that once extends in the direction away from the board 140, a length dimension of the terminal portion 115, 125 is substantially prolonged. As a result, the flexure amount of the prolonged terminal portion 115, 125 within the range of elastic deformation increases.

Further, a difference in expansion/retraction degree between the pitch between the contacts 111 and 121 and the contact pitch of the board 140 can be absorbed by the increased flexure amount to thereby reduce a load applied to the solder joint portion 115*d*, 125*d*.

Figure 21:
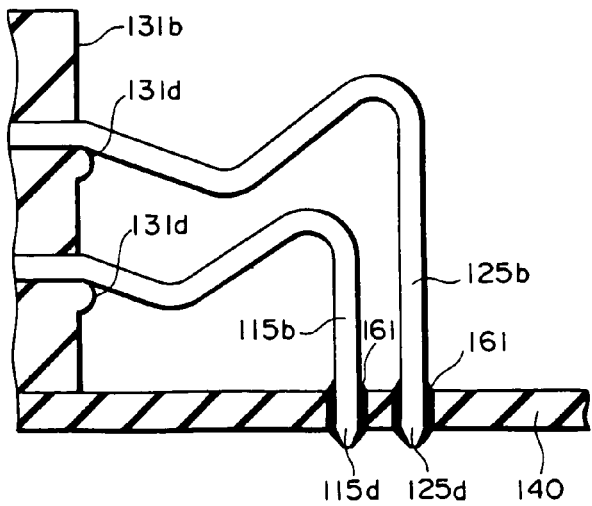
FIG. 21 is an enlarged sectional view showing the state where the contacts of the connector as explained in FIGS. 14 and 15 are connected to the board.

FIG. 21 shows the state where the connector 110 shown in FIG. 15 is mounted on the board 140. As shown in FIG. 21, length dimensions of the terminal portions 115 and 125 are adjusted. Then, the solder joint portions 115*d* and 125*d* of the second portions 115*b* and 125*b* are connected to the through holes 140*b* (see FIG. 15) by solder 161.

Figure 22:
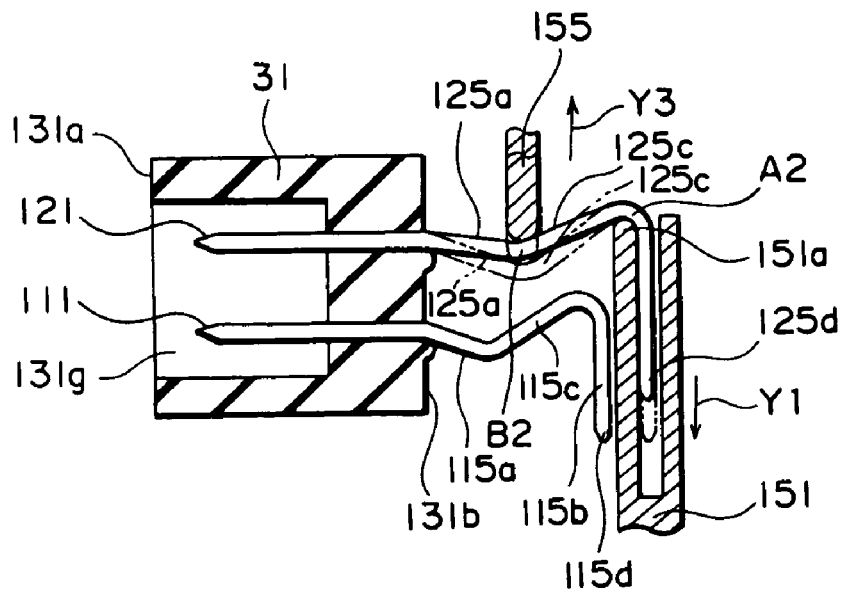
FIG. 22 is a sectional view showing a method of adjusting a length dimension of a terminal portion of the contact when the length dimension of the terminal portion of the contact as explained in FIG. 18 does not reach a prescribed value.

FIG. 22 shows a method of adjusting the length dimension of the terminal portion 125 when the length dimension of the terminal portion 125 of the second contact 121 as explained referring to FIG. 18 does not reach a prescribed value necessary for the connection by soldering.

Referring to FIG. 22, when the length dimension of the terminal portion 125 does not reach the prescribed value, i.e. when the length dimension of the terminal portion 125 is less than the prescribed value, the position of the fulcrum B2 as the bending start point of the joining portion between the first and third portions 125*a* and 125*c* is moved upward (in a direction of an arrow Y3 shown in FIG. 22) over the surface 140*a* of the board 140 to thereby shorten a length dimension of the terminal portion 125 required for formation of the terminal portion 125 from the fulcrum B2 to the solder joint portion 125*d*. As a result, it becomes possible to move the position of the solder joint portion 125*d* toward the board 140 (in a direction of an arrow Y1 shown in FIG. 22). Through the adjustment of the terminal portion 125 as described above, the prescribed value of the length dimension of the terminal portion 125 can be easily satisfied.

Figure 23:
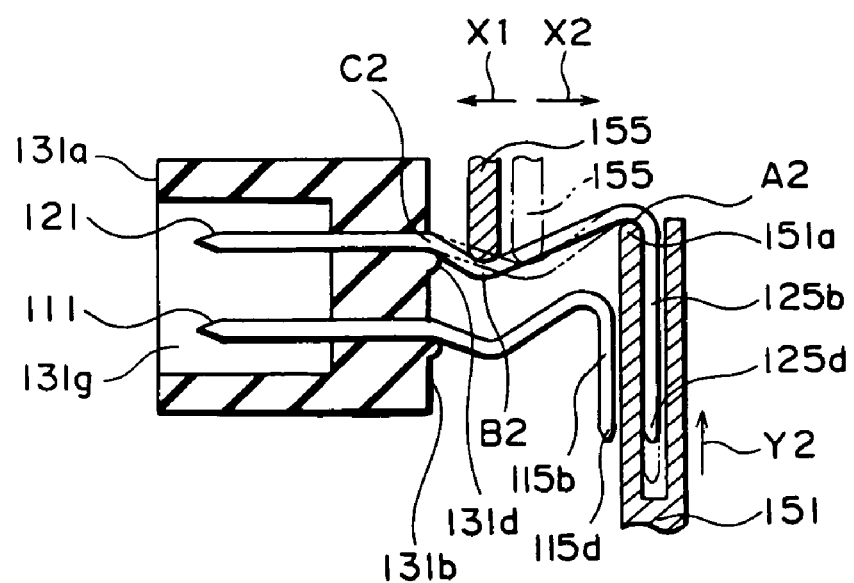
FIG. 23 is a sectional view showing a method of adjusting a length dimension of the terminal portion of the contact when the length dimension of the terminal portion of the contact as explained in FIG. 18 exceeds a prescribed value.

Referring to FIG. 23, when the length dimension of the terminal portion 125 exceeds the prescribed value, i.e. when the length dimension of the terminal portion 125 is greater than the prescribed value, the length dimension of the terminal portion 125 is prolonged. For prolonging the length dimension of the terminal portion 125, the position of the fulcrum B2 as the bending start point of the joining portion between the first and third portions 125a and 125c is moved toward the rear-side surface 131b of the insulator 131 (in a direction of an arrow X1 shown in FIG. 23) to thereby prolong the length dimension of the terminal portion 125. Alternatively, by moving the position of the fulcrum B2 away from the rear-side surface 131b of the insulator 131 (in a direction of an arrow X2 shown in FIG. 23), a length dimension of the terminal portion 125 required for formation of the terminal portion 125 from the fulcrum B2 to the solder joint portion 125d can be prolonged. As a result, it becomes possible to move the position of the solder joint portion 125d toward the board 140 (in a direction of an arrow Y2 shown in FIG. 23). Through the adjustment of the terminal portion 125 as described above, the prescribed value of the length dimension of the terminal portion 125 can be easily satisfied.

Figure 24:
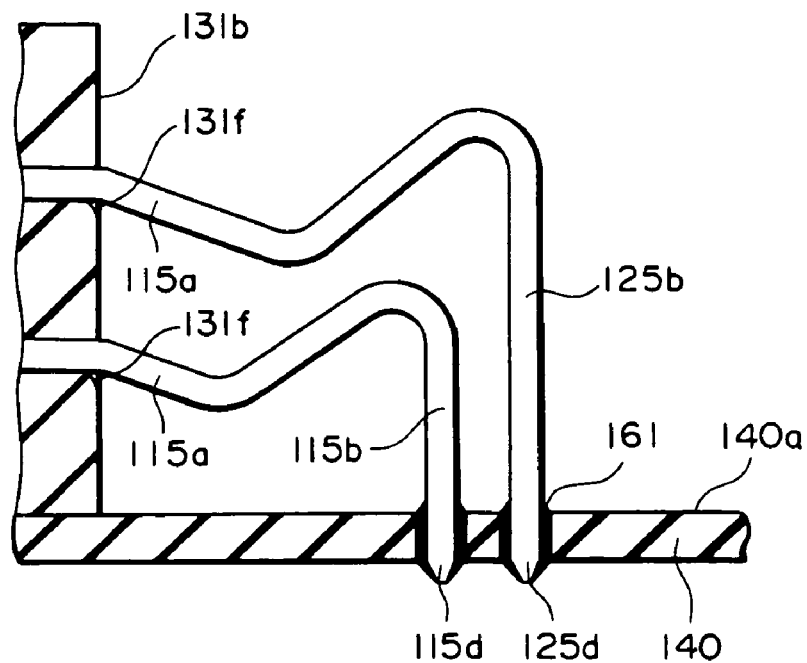
FIG. 24 is an enlarged sectional view showing a modification of an insulator of the connector as explained in FIGS. 14 and 15.

Instead of the projection 131d provided on the insulator 131 and enlargedly shown in FIG. 21, a cutout 131f may be formed by cutting an edge portion of the through hole 131c on the side of the rear-side surface 131b into a circular arc shape in cross section or an inclined surface shape, as shown in FIG. 24.

Figure 25:
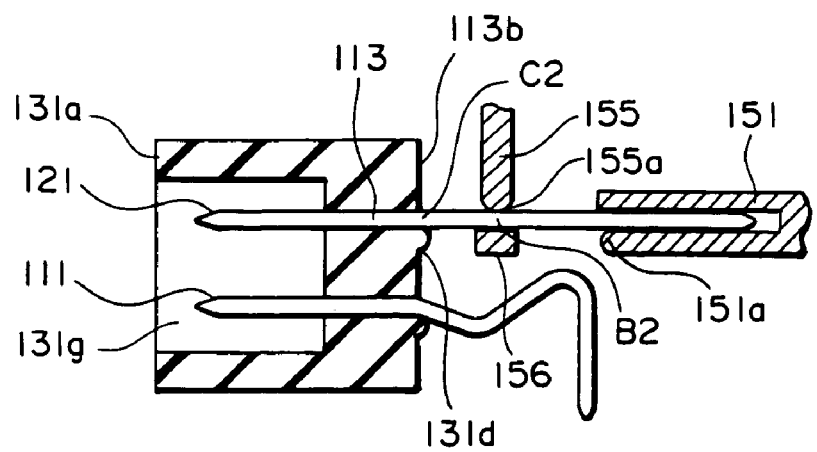
FIG. 25 is a sectional view showing a modification of the method of adjusting the length dimension of the terminal portion in the bending process of the contact as explained in FIGS. 14 and 15.

FIG. 25 shows a modification of the method of adjusting the length dimension in the terminal portion 125 in the bending process of the second contact 121 as explained referring to FIGS. 16 to 18.

Referring to FIG. 25, the end surface 155a of the second bending tool 155 is brought into contact, from above, with the joining portion between the first and third portions 125a and 125c. Further, a third bending tool 156 is brought into contact, from below, with the joining portion between the first and third portions 125a and 125c.

Inasmuch as the second and third bending tools 155 and 156 cooperatively clamp the joining portion between the first and third portions 125a and 125c so as to sandwich it therebetween in a thickness direction of the second contact 121, it is possible to prevent the terminal portion 125 from being deformed or from being pulled in a direction parallel to the board 140 so as to be deviated, during the bending process.

Figure 26:
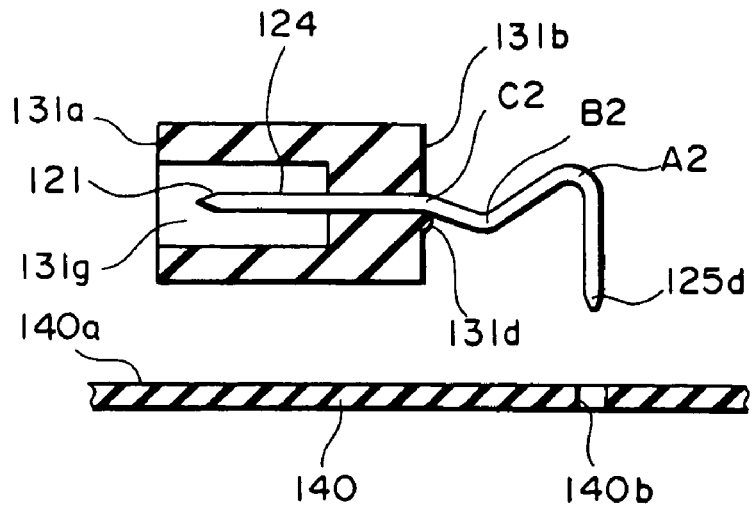
FIG. 26 is a sectional view showing a modification wherein contacts are arranged only in one row and retained by the insulator shown in FIGS. 14 and 15.

FIG. 26 shows a modification wherein only the contacts 121 are arranged in one row over the surface 140a of the board 140 and retained by the insulator 131 shown in FIGS. 14 and 15.

Figure 27:
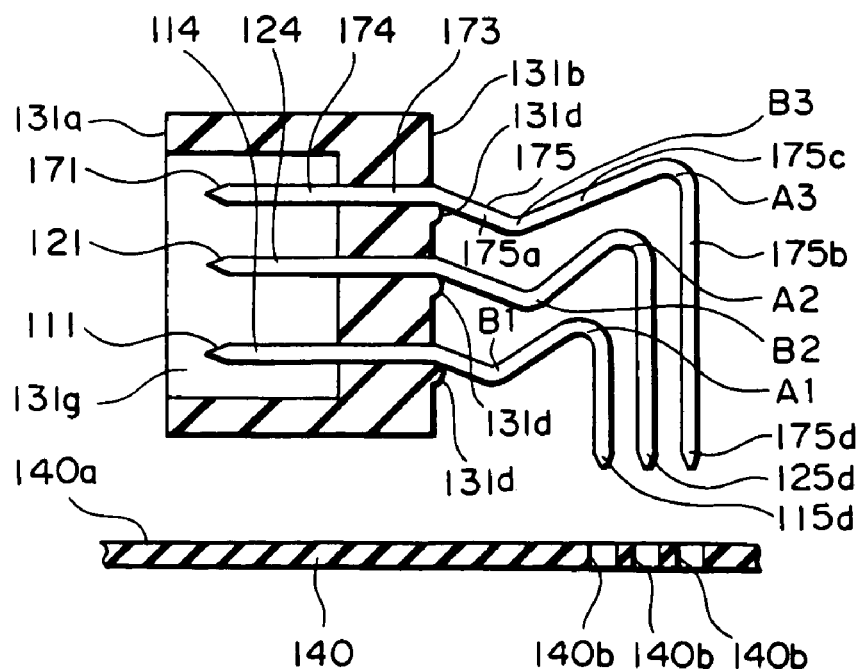
FIG. 27 is a sectional view showing a modification wherein contacts are arranged in multi-rows and retained by the insulator shown in FIGS. 14 and 15.

FIG. 27 shows a modification wherein the first and second contacts 111 and 121, and third contacts 171 in a further upper row are arranged in three rows and retained by the insulator 131 shown in FIGS. 14 and 15. Each third contact 171 comprises a retention portion 173, a contact portion 174, and a terminal portion 175 having shapes like the shapes of those of the first and second contacts 111 and 121.

The terminal portion 175 comprises a first portion 175a, a second portion 175b, and a third portion 175c having shapes like the shapes of those of the terminal portions 115 and 125 of the first and second contacts 111 and 121. The terminal portion 175 has a fulcrum A3 at a joining portion between the second and third portions 175b and 175c, and a fulcrum B3 at a joining portion between the first and third portions 175a and 175c.

A tip portion of the terminal portion 175 serves as a solder joint portion 175d. The solder point portion 175d is inserted into a through hole 140b of the board 140 and connected thereto by soldering.

As described above, in accordance with the connector and the production method of the connector according to the first embodiment of the present invention, the terminal portion of the contact is formed into the shape that once extends in the direction away from the board, so that the length dimension of the terminal portion can be substantially prolonged.

When forming the shape of the terminal portion, the contact is bent in opposite directions at the joining portion between the first and third portions and at the joining portion between the second and third portions. Consequently, the directions in which the springbacks occur are also opposite to each other at the joining portion between the first and third portions and at the joining portion between the second and third portions, and therefore, there is the effect that the springbacks can be canceled on the whole.

Therefore, with respect to the contacts in the first embodiment, it is possible to solve the problem of interference between the solder joint portions of the terminal portions caused by the springback. Consequently, it becomes possible to achieve the bending process without expecting the springbacks upon performing the bending process.

Further, with respect to the contacts in the first embodiment, inasmuch as the problem of interference between the solder joint portions is not raised, the interval between the second portions can be set narrower for the processing. This makes it possible to reduce the mounting area of the connector on the board.

As a result, the flexure amount of the prolonged terminal portion within the range of elastic deformation can be increased. Consequently, a difference in expansion/retraction degree between the contacts of the insulator and the board can be absorbed by the increased flexure amount to thereby reduce a load applied to the solder joint portion.

The shape of the contact according to the first embodiment can be easily formed by bending the contact along the curve-shaped portion of the bending tool placed on an inner side of the terminal portion, then applying a thrust to a bent curve-shaped portion of the contact in the direction away from the board. Since the contact is bent along the curve, there occurs no concentration of stresses like in a narrow region such as a corner.

With respect to the connector in the second embodiment, since the terminal portion of the contact is formed into the shape that is once bent in the direction approaching the board, then extends in the direction away from the board, the length dimension of the terminal portion can be substantially prolonged.

When forming the shape of the terminal portion, the contact is bent in opposite directions at the joining portion between the first and third portions and at the joining portion between the second and third portions. Consequently, the directions in which the springbacks occur are also opposite to each other at the joining portion between the first and third portions and at the joining portion between the second and third portions, and therefore, the springbacks can be canceled on the whole.

Therefore, with respect to the contacts in the second embodiment, it is possible to solve the problem of interference between the solder joint portions of the terminal portions caused by the springback. Consequently, it becomes possible to achieve the bending process without expecting the springbacks upon performing the bending process.

Further, with respect to the contacts in the second embodiment, inasmuch as the problem of interference between the solder joint portions is not raised, the interval between the second portions can be set narrower for the processing. This makes it possible to reduce the mounting area of the connector on the board.

As a result, the flexure amount of the prolonged terminal portion within the range of elastic deformation can be increased. Consequently, a difference in expansion/retraction degree between the contacts of the insulator and the board can be absorbed by the increased flexure amount to thereby reduce a load applied to the solder joint portion.

The shape of the contact according to the second embodiment can be easily formed by bending the contact along the curve-shaped portion of the bending tool placed on an inner side of the terminal portion, then applying a thrust to a bent curve-shaped portion of the contact in the direction away from the board. Since the contact is bent along the curve, there occurs no concentration of stresses like in a narrow region such as a corner.

Conventionally, it was necessary to newly produce a contact forming press die, or remodel a connector insulator die for adjusting the length dimension of the terminal portion. On the other hand, in the present invention, by providing the bending fulcrum on a side of the contact extending outward from the rear-side surface of the insulator, which is opposite to a side of the contact confronting the board, and by moving the position of this bending fulcrum in the direction toward or away from the surface of the board, or in the direction toward or away from the insulator when performing the bending process, the length dimension of the terminal portion extending substantially perpendicularly relative to the board can be adjusted by the use of only the bending tools.

Further, when the contact extending outward from the rear-end wall surface of the insulator is clamped upon adjusting the length dimension of the terminal portion, it is possible to adjust the length dimension of the terminal portion by the use of only the bending tools like the foregoing, and further, it is possible to prevent the terminal portion itself from being pulled in the direction parallel to the board so as to be deviated due to resistance caused by the bending process.

Further, the contact is formed into the shape that can prevent an excessive stress from being applied to the solder joint portion even when it is subjected to the temperature cycle. Moreover, even when the length dimension of the terminal portion to be connected to the board by soldering does not satisfy the prescribed value range in the stage of producing the connector, the prescribed length dimension of the terminal portion can be easily satisfied without increasing the cost.

What is claimed is:

1. A connector comprising an insulator to be mounted on one surface of a board, and a conductive contact retained by said insulator, said contact including a terminal portion extending outward from a one-side surface of said insulator so as to be connected to said board, wherein said terminal portion comprises a first portion extending outward from said one-side surface of said insulator so as to approach said one surface of said board when said insulator is mounted on said one surface of said board, a second portion bent to extend so as to be connected to said board when said insulator is mounted on said one surface of said board, and a third portion joining between said first and second portions in a predetermined position spaced apart from said one-side surface of said insulator, said second and third portions are bent using a joining portion between said second and third portions as a fulcrum, and said first and third portions are bent using a joining portion between said first and third portions as a fulcrum, and said third portion is bent so as to be inclined away from said one surface of said board in a direction from said fulcrum at said joining portion between said first and third portions toward said fulcrum at said joining portion between said second and third portions when said insulator is mounted on said one surface of said board.

2. A connector according to claim 1, wherein said second portion is bent perpendicularly relative to said first portion.

3. A connector according to claim 1, wherein said one-side surface of said insulator is formed with a projection in the neighborhood of said first portion on a side near said one surface of said board.

4. A connector according to claim 1, wherein said one-side surface of said insulator is formed with a cutout in the neighborhood of said first portion on a side near said one surface of said board, said cutout formed by cutting off a portion of said insulator into a circular arc shape in cross section or an inclined surface shape.

5. A method of producing a connector comprising an insulator to be mounted on one surface of a board, and a conductive contact retained by said insulator, said contact including a terminal portion extending outward from a one-side surface of said insulator so as to be connected to said board, wherein said terminal portion comprises a first portion extending outward from said one-side surface of said insulator so as to be substantially parallel to said one surface of said board when said insulator is mounted on said one surface of said board, a second portion bent to extend so as to be connected to said board when said insulator is mounted on said one surface of said board, and a third portion joining between said first and second portions, said method comprising the steps of:

bending, after retaining said contact by said insulator, said second portion using a joining portion between said second and third portions as a fulcrum from a shape in which said second and third portions extend in the same direction as said first portion, by the use of a first bending tool so that said second portion is connected to said board; and bending said third portion at a joining portion between said first and third portions as a fulcrum by the use of a second bending tool so as to be inclined away from said one surface of said board in a direction toward said fulcrum at said joining portion between said second and third portions when said insulator is mounted on said one surface of said board.

6. A method according to claim 5, wherein said second portion is bent perpendicularly relative to said first portion.

7. A method according to claim 5, wherein a length dimension of said terminal portion relative to said board is adjusted by moving said fulcrum at said joining portion between said first and third portions in a direction toward said insulator or away from said insulator upon bending said third portion.

8. A method according to claim 5, wherein said fulcrum at said joining portion between said first and third portions is sandwiched between said second bending tool and a third bending tool in a thickness direction of said terminal portion so as to be clamped upon bending said third portion.

9. A method according to claim 5, wherein said first bending tool is brought into contact with an inner side, in a bending direction, of said fulcrum at said joining portion between said second and third portions so as to bend it along a curve-shaped portion formed on said first bending tool.

10. A method of producing a connector comprising an insulator to be mounted on one surface of a board, and a conductive contact retained by said insulator, said contact including a terminal portion extending outward from a one-side surface of said insulator so as to be connected to said board, wherein said terminal portion comprises a first portion extending outward from said one-side surface of said insulator so as to approach said one surface of said board when said insulator is mounted on said one surface of said board, a second portion bent to extend so as to be connected to said board when said insulator is mounted on said one surface of said board, and a third portion joining between said first and second portions in a predetermined position spaced apart from said one-side surface of said insulator, said method comprising the steps of:

bending, after retaining said contact by said insulator, said second portion using a joining portion between said second and third portions as a fulcrum from a shape in which said second and third portions extend in the same direction as said first portion, by the use of a first bending tool so that said second portion is connected to said board; and bending a joining portion between said first and third portions by moving said first and third portions, using a second bending tool, such that said first portion is inclined from said one-side surface of said insulator to cause a fulcrum at said joining portion between said first and third portions to approach said one surface of said board, and said third portion is inclined away from said one surface of said board in a direction from said joining portion between said first and third portions toward said joining portion between said second and third portions.

11. A method according to claim 10, wherein, after bending said second portion using said joining portion between said second and third portions as the fulcrum, said first bending tool is moved away from said one surface of said board while engaging with said joining portion between said second and third portions and using said fulcrum at said joining portion between said first and third portions, and said first and third portions are moved by said second bending tool so that said fulcrum at said joining portion between said first and third portions approaches said one surface of said board, thereby to bend said joining portion between said first and third portions.

12. A method according to claim 10, wherein said second portion is bent perpendicularly relative to said first portion.

13. A method according to claim 10, wherein a length dimension of said terminal portion relative to said board is adjusted by moving said fulcrum at said joining portion between said first and third portions in a direction toward said insulator or away from said insulator.

14. A method according to claim 10, wherein said fulcrum at said joining portion between said first and third portions is sandwiched between said second bending tool and a third bending tool in a thickness direction of said terminal portion so as to be clamped upon bending said joining portion between said first and third portions.

15. A method according to claim 10, wherein said first bending tool is brought into contact with an inner side, in a bending direction, of said fulcrum at said joining portion between said second and third portions so as to bend it along a curve-shaped portion formed on said first bending tool.

16. A method according to claim 10, wherein said one-side surface of said insulator is formed with a projection in the neighborhood of said first portion on a side near said one surface of said board, and said first portion is bent along said projection in a direction to approach said board.

17. A method according to claim 10, wherein said one-side surface of said insulator is formed with a cutout in the neighborhood of said first portion on a side near said one surface of said board, said cutout formed by cutting off a portion of said insulator into a circular arc shape in cross section or an inclined surface shape, and said first portion is bent along said cutout in a direction to approach said board.

\* \* \* \* \*